(12) United States Patent
Friendshuh et al.

(10) Patent No.: US 8,724,401 B2
(45) Date of Patent: May 13, 2014

(54) DATA STRIPES AND ADDRESSING FOR FLASH MEMORY DEVICES

(75) Inventors: Luke William Friendshuh, Elko, MN (US); Mark Allen Gaertner, Vadnais Heights, MN (US); Jonathan Williams Haines, Boulder, CO (US); Timothy Richard Feldman, Louisville, CO (US)

(73) Assignee: Seagate Technology LLC, Cupertino, CA (US)

( * ) Notice: Subject to any disclaimer, the term of this patent is extended or adjusted under 35 U.S.C. 154(b) by 485 days.

(21) Appl. No.: 12/568,729

(22) Filed: Sep. 29, 2009

(65) Prior Publication Data
US 2011/0075490 A1  Mar. 31, 2011

(51) Int. Cl.
*G11C 11/34* (2006.01)
*G06F 13/00* (2006.01)
*G11C 19/00* (2006.01)
*G11C 19/08* (2006.01)
*G06F 12/00* (2006.01)

(52) U.S. Cl.
CPC ............. *G11C 19/00* (2013.01); *G11C 19/08* (2013.01); *G06F 12/00* (2013.01); *G06F 13/0246* (2013.01)
USPC ............ 365/185.33; 365/185.12; 365/185.18; 711/100; 711/114; 711/170; 711/173; 711/103

(58) Field of Classification Search
CPC ............. G11C 19/00; G11C 19/0858; G11C 19/0883; G11C 19/0833; G11C 19/08
USPC ........... 365/185.33, 185.18, 185.12; 711/100, 711/114, 170, 173, 103
See application file for complete search history.

(56) References Cited

U.S. PATENT DOCUMENTS

| | | | |
|---|---|---|---|
| 5,630,093 A | 5/1997 | Holzhammer et al. | |
| 5,889,795 A * | 3/1999 | Niijima et al. | 714/766 |
| 5,905,993 A | 5/1999 | Shinohara | |
| 6,018,778 A | 1/2000 | Stolowitz | |
| 6,441,427 B1 | 8/2002 | Yamada et al. | |
| 6,907,499 B2 * | 6/2005 | Herbst et al. | 711/112 |
| 6,934,804 B2 | 8/2005 | Hashemi | |
| 7,073,010 B2 | 7/2006 | Chen et al. | |
| 7,133,941 B2 * | 11/2006 | Klein et al. | 710/36 |
| 2005/0144363 A1 * | 6/2005 | Sinclair | 711/103 |
| 2007/0245181 A1 * | 10/2007 | Suda | 714/718 |
| 2009/0172335 A1 * | 7/2009 | Kulkarni et al. | 711/170 |
| 2010/0172179 A1 * | 7/2010 | Gorobets et al. | 365/185.09 |
| 2011/0040926 A1 * | 2/2011 | Frost et al. | 711/103 |

* cited by examiner

*Primary Examiner* — Thao H Bui
(74) *Attorney, Agent, or Firm* — Westman, Champlin & Koehler, P.A.

(57) ABSTRACT

Data stripes and addressing for flash memory devices are provided. Flash memory devices illustratively have a plurality of programmable devices that are capable of simultaneously storing data. A plurality of erasure blocks are within each of the programmable devices, and each erasure block has pages of transistors. The flash memory devices are logically organized as a plurality of stripes. Each stripe has a height and a width. In an embodiment, the stripe height is greater than one page. In another embodiment, the stripe width is less than all of the programmable devices within the flash memory device.

17 Claims, 7 Drawing Sheets

DATA STRIPES AND ADDRESSING FOR FLASH MEMORY DEVICES

BACKGROUND

Flash memory devices store data to and retrieve data from transistors. Commonly, the transistors are grouped into pages, pages are grouped into erasure blocks, and erasure blocks are grouped into programmable devices. Data is written to flash devices at the page level, and data is erased from flash devices at the block level. Before writing to a particular page, all of the pages in the block are erased.

One issue with flash memory devices has been limited life times. The flash transistors are only able to be programmed and erased a finite amount of times. Another issue has been writing performance. Although data is generally read from flash devices relatively quickly, writing data to and erasing data from flash devices can be time consuming.

SUMMARY

An aspect of the disclosure relates to data stripes and addressing for flash memory devices. Flash memory devices illustratively have a plurality of programmable devices that are capable of simultaneously storing data. A plurality of erasure blocks are within each of the programmable devices, and each erasure block has pages of transistors. The flash memory devices are logically organized as a plurality of stripes. Each stripe has a height and a width. In an embodiment, the stripe height is greater than one page. In another embodiment, the stripe width is less than all of the programmable devices within the flash memory device.

These and various other features and advantages that characterize the claimed embodiments will become apparent upon reading the following detailed description and upon reviewing the associated drawings.

DETAILED DESCRIPTION

The present disclosure includes flash memory devices and methods that in at least certain embodiments improve or optimize writing performance and device lifetimes. For instance, an incoming write command may have less data than can be stored in an erasure block. Instead of writing the data to only one block, the data is segmented and written to multiple blocks. This illustratively improves performance by reducing writing times. For example, if it would take eight seconds to write the data in a write command to one block, it would only take two seconds to write all the data if the data is segmented and written concurrently to four blocks. In another embodiment, lifetimes are improved or optimized by selecting the optimal number of blocks that are written to at one time. For instance, it may be quickest to segment a write command such that it can be written to all available blocks concurrently. However, if it is later desired to erase that data, all of the blocks would likely need to be erased. This could limit device lifetime by increasing the number of program and erase cycles. Accordingly, in certain embodiments, the number of blocks and the number of pages within a block are optimized to both increase writing performance and to limit the number of program and erase cycles to extend device lifetimes.

Before going into further details of embodiments, it is worthwhile to first discuss illustrative operating environments in which certain embodiments may be incorporated. Although certain embodiments may be incorporated in environments such as those shown in FIGS. 1-3, embodiments are not limited to any particular environment and are illustratively practiced in any number of environments.

Figure 1:
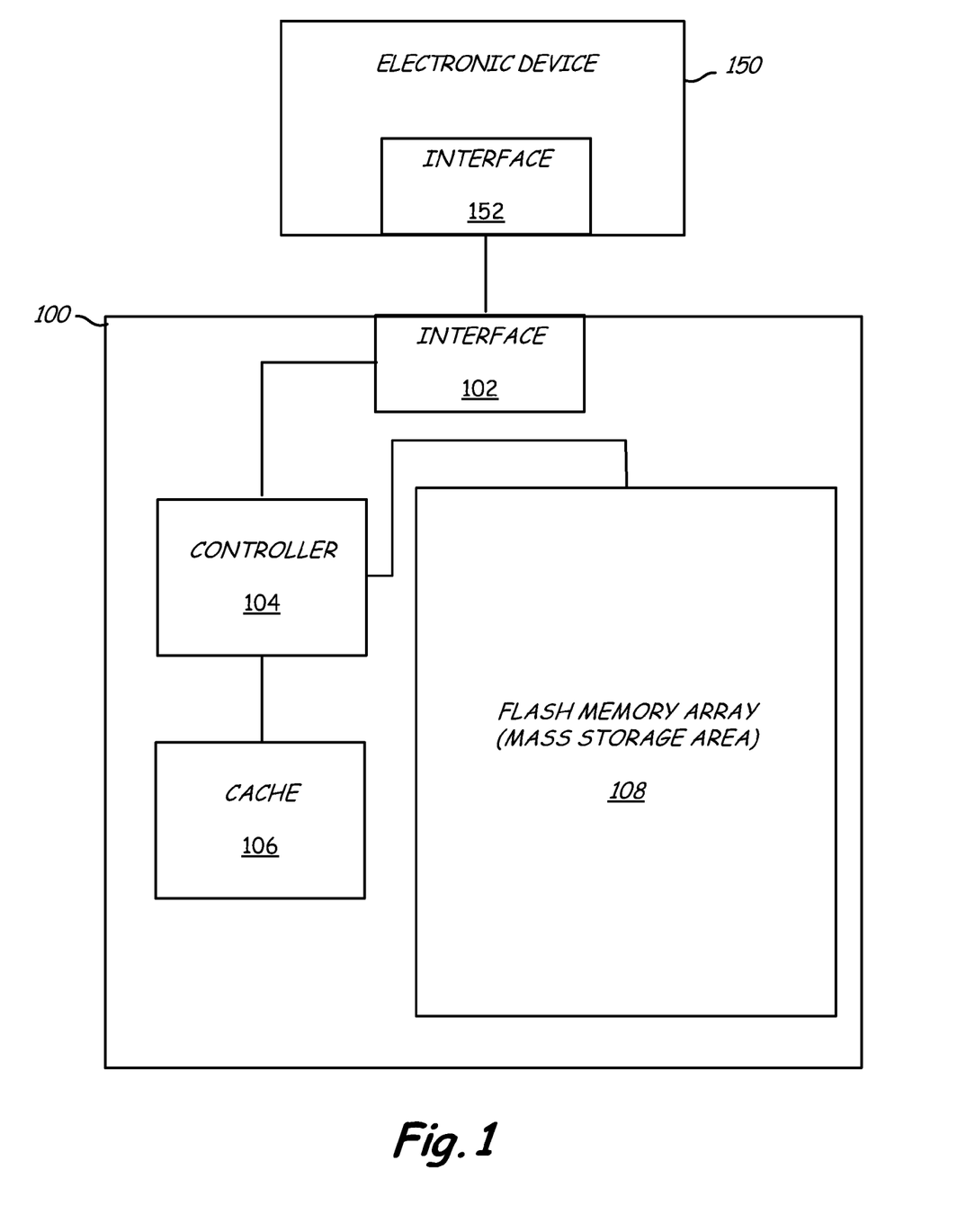
FIG. 1 is a schematic diagram of an electronic device communicatively coupled to a flash memory device.

FIG. 1 is a schematic diagram of a flash memory device 100 communicatively coupled to an electronic device 150. Flash memory device 100 includes an interface 102, a controller 104, a cache memory 106, and a flash memory array 108. Interface 102 is illustratively coupled to an interface 152 of electronic device 150 such that information or data can be exchanged or sent back and forth between electronic device 150 and memory device 100. Electronic device 150 includes any electronic device such as, but not limited to, a personal computer, a cell phone, a camera, a music player, a gaming device, a host controller, or a personal digital assistant.

Controller 104 illustratively controls or manages the storing of data to array 108 and the retrieval of data from array 108. Controller 104 optionally uses cache memory 106 in storing and retrieving information from array 108. For example, controller 104 is illustratively configured to store data to cache 106 until an appropriate amount of data is accumulated, and controller 104 then transfers the data from cache 106 to array 108.

Cache 106 is illustratively implemented as volatile or non-volatile memory. Examples of non-volatile memory include, but are not limited to, battery backed-up DRAM and pre-erased flash memory. Embodiments that include non-volatile memory may be beneficial in certain environments in which it is desirable to not lose information if power is lost.

Figure 2:
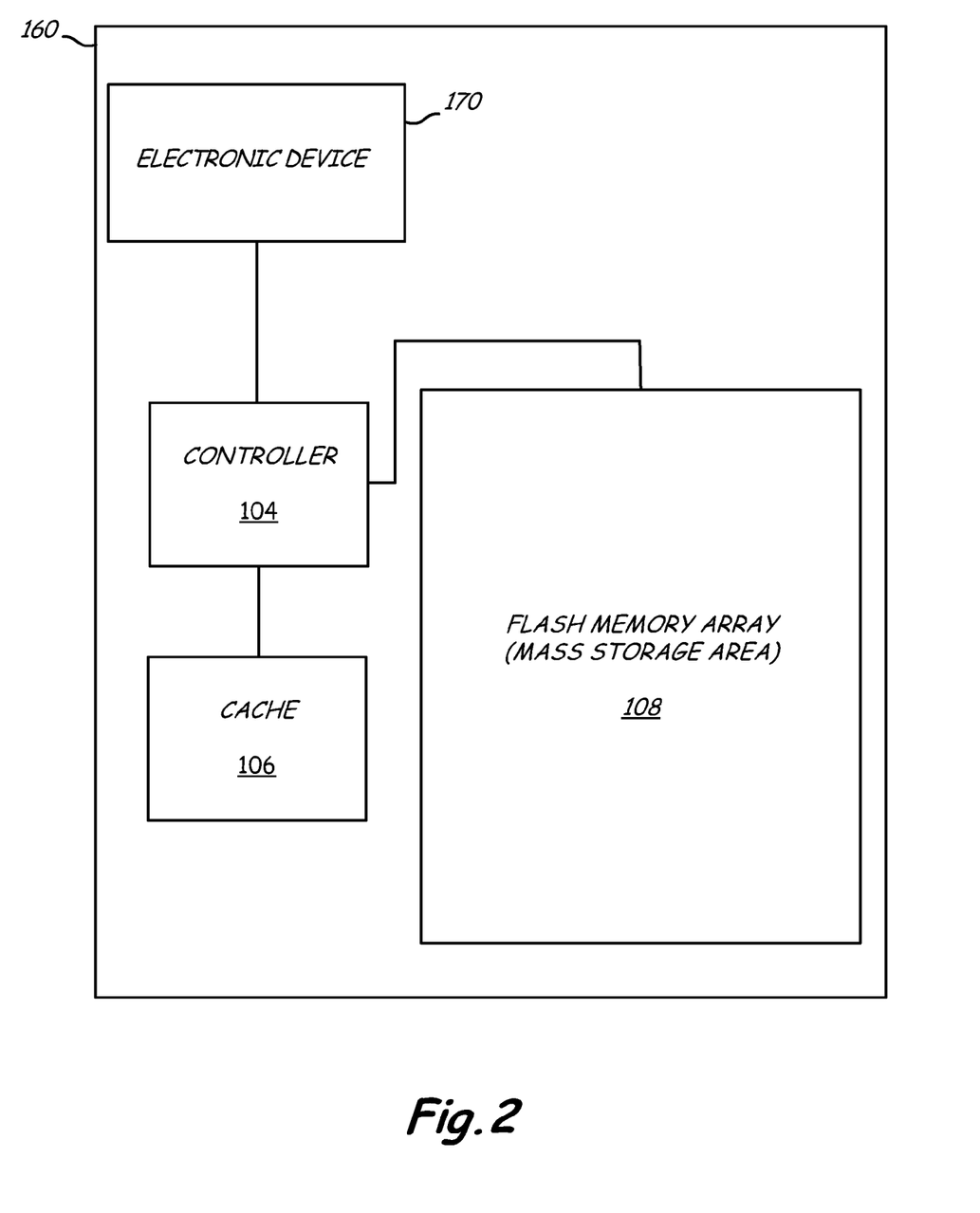
FIG. 2 is a schematic diagram of an electronic device having integrated flash memory.

FIG. 2 is a schematic diagram of an electronic device 170 having integrated flash memory. The environment shown in FIG. 2 has many of the same or similar components as the environment shown in FIG. 1 such as memory controller 104, cache 106, and array 108. The environment shown in FIG. 2 however differs from that in FIG. 1 in that the electronic components are integrated onto one printed circuit board 160. In such a case, electronic device 170 is illustratively communicatively coupled directly to memory controller 104 instead of through one or more interfaces such as those shown in FIG. 1.

Figure 3:
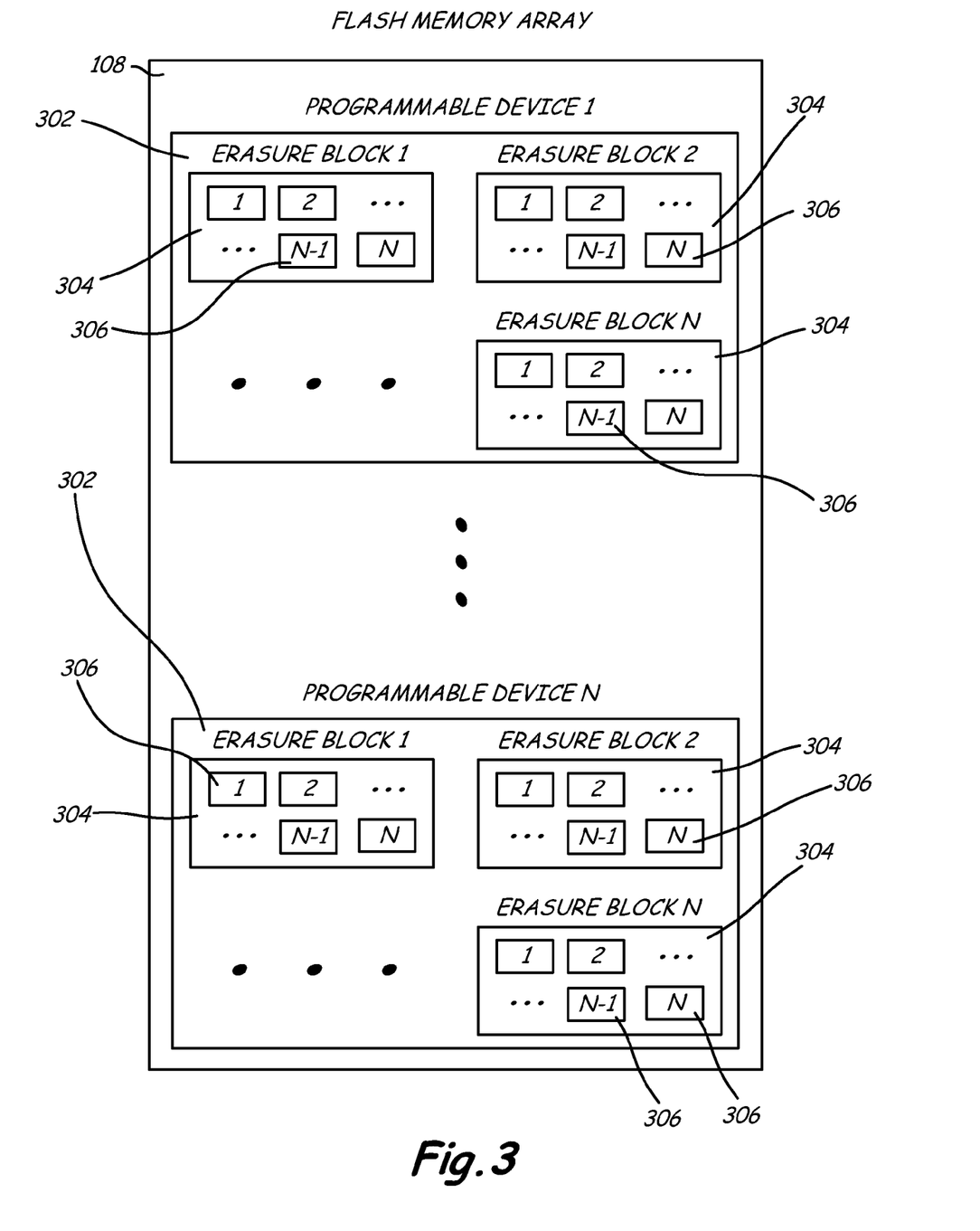
FIG. 3 is a schematic diagram of a flash memory mass storage array.

FIG. 3 is a schematic diagram of one configuration of memory array 108. Array 108 includes programmable devices 302, erasure blocks 304, and pages 306. Embodiments illustratively include any number of devices 302, blocks 304, and pages 306. As is shown in the figure, array 108 includes N number of programmable devices 302, erasure blocks 304, and pages 306, where N is any number. Some examples of numbers included in embodiments, for illustration purposes only and not by limitation, include pages of 2 or 4 kilobytes, 64 pages per a block, and 128 programmable devices.

In one embodiment, programmable devices 302 are able to operate concurrently. For example, each programmable device 302 in array 108 is illustratively able to store and/or retrieve data simultaneously. Programmable devices 302 are optionally grouped or paired together. For example, for illustration purposes only and not by limitation, programmable devices 302 are grouped into pairs of dual programmable devices, and each group of dual programmable devices is able to store and/or retrieve data simultaneously. Similarly, pages 306 and blocks 304 are optionally grouped or paired together such as, but not limited to, dual pages or dual blocks.

As was previously mentioned, FIGS. 1-3 are merely illustrative operating environments. Embodiments of the present disclosure are optionally practiced within any number of different types of operating environments. For example, in one embodiment of a flash memory device, the storing and retrieval of information to and from the flash memory array are performed or managed by an external device. In another embodiment, the components of a flash memory device are comprised in one physical unit (e.g. one piece of silicon or one printed circuit board). In yet another embodiment, the components are comprised in separate physical units (e.g. multiple pieces of silicon or multiple printed circuit boards).

Figure 4:
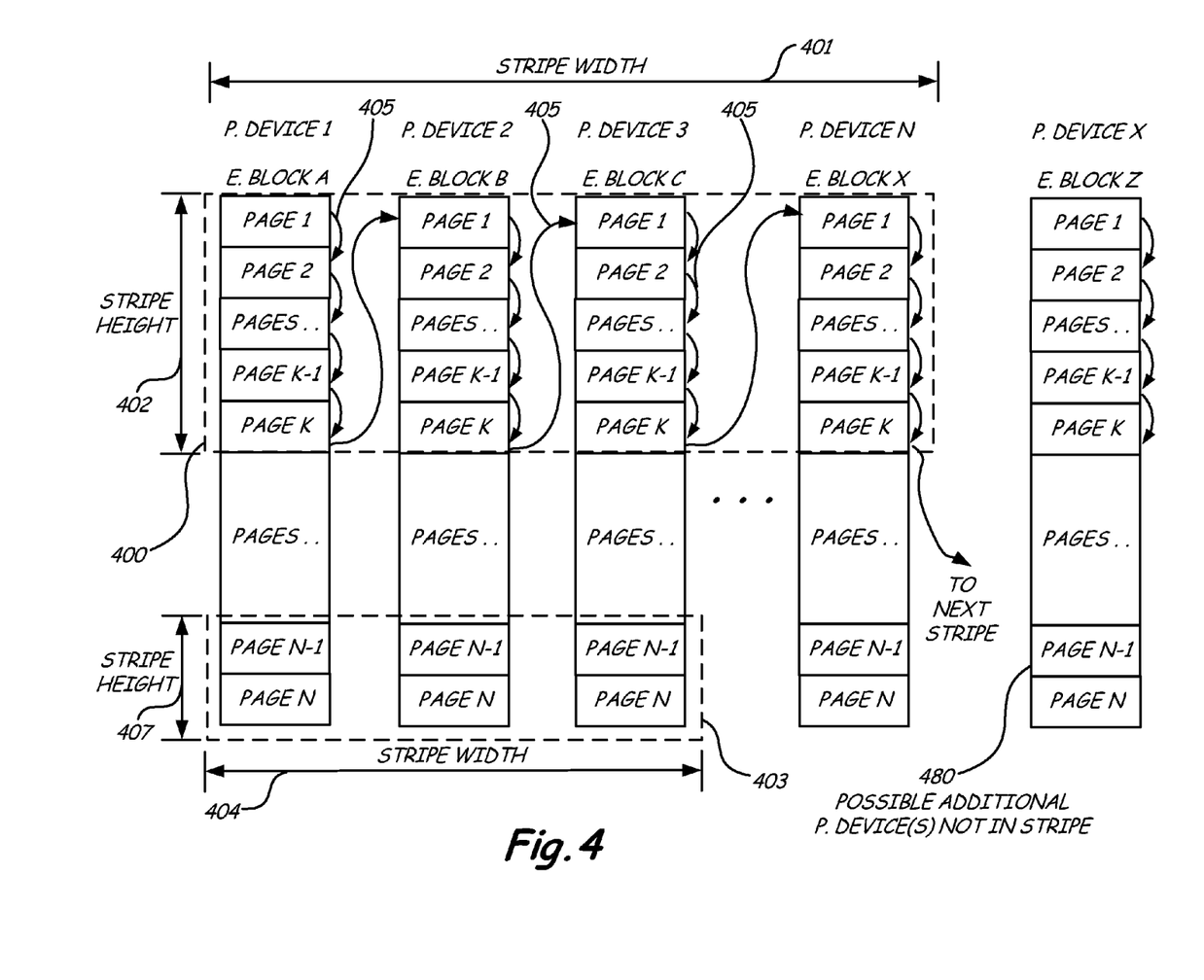
FIG. 4 is a schematic diagram of a flash memory data stripe.

FIG. 4 is a schematic diagram of a flash memory which includes a data stripe 400. Stripe 400 includes a width 401 and a height 402. Width 401 is illustratively represented by a number of programmable devices. In FIG. 4, width 401 is N programmable devices where N is any number. As will be discussed in greater detail later, in one embodiment, the number of programmable devices in a stripe is less than the total number of programmable devices in the flash memory array. For example, for illustration purposes only and not by limitation, a stripe could include 10 or 32 programmable devices out of a total of 64 or 128 programmable devices in a flash memory array. FIG. 4 is shown as having possible additional programmable device(s) 480 that is/are not included within stripe 400. Embodiments illustratively include any number, including zero, of additional programmable devices that are not included within a stripe (i.e. all the programmable devices are within the stripe or a fraction of the programmable devices are within the stripe).

Stripe height 402 illustratively corresponds to a number of pages within an erasure block. In FIG. 4, height 402 is K pages where K is any number including one in the case of a single page configuration or two in a dual page configuration. Again, as will be discussed in greater detail later, in one embodiment, stripe height 402 is less than the total number of pages within an erasure block. For example, for illustration purposes only and not by limitation, a stripe height could be twenty pages out of a total of sixty-four pages within an erasure block. In yet another embodiment, stripe height 402 includes all of the pages within an erasure block.

In an embodiment, flash memory devices include multiple stripes. In one embodiment, at least some of the multiple stripes within a flash device illustratively have the same width 401 (i.e. the same number of programmable devices per a stripe) and the same height 402 (i.e. the same number of pages within an erasure block). In another embodiment, stripes within a flash memory device have different sizes. For example, stripes 400 and 403 within a flash memory device optionally have different widths 401 and 404 and/or heights 402 and 407.

FIG. 4 includes arrows 405 that represent the order or the path in which data is stored to the stripe. For instance, in the figure, incoming data is stored first starting at Page 1 of Erasure Block A and stored last at Page K of Erasure Block X. It should be noted that the order described above does not necessarily correspond to a time based order. The order described above is more of a roadmap of where to store data. For instance, if a flash memory device receives a write command that is the same size as the stripe (e.g. the same amount of kilobytes), the write command is segmented and each programmable device within the stripe stores data to its page or pages at the same time.

It should also be noted that certain embodiments also cache write commands. This illustratively includes storing one or more write commands to a volatile or non-volatile cache memory before storing the write commands to the flash memory array. For example, a flash memory device may have several write commands in its cache. The first write command may only have enough data to fill the pages of two programmable devices within a stripe. The flash memory device illustratively retrieves and begins to store other write commands such that all of the programmable devices within the stripe are storing data. In another embodiment, flash memory devices have caches but store write commands sequentially, or do not have caches and store write command sequentially. Furthermore, it should be noted that flash memory devices optionally write to one stripe at a time or to multiple stripes in parallel.

Before further discussing details of embodiments, it is worthwhile to highlight a few of the advantages of the devices and methods described above. Having stripe heights greater than one page and stripe widths less than all of the programmable devices independently and in combination improve device performance and lifetime. As was mentioned in the background section, pages are not erased individually. Instead, all of the pages within an erasure block are erased at the same time. Accordingly, if a write command is written to fewer erasure blocks, as is the case when stripe heights are greater than one page and stripe widths are less than all of the programmable devices, fewer blocks need to be erased to delete or modify the write command. This may improve lifetime by reducing the number of program and erase cycles that transistors within a page endure. Additionally, using stripe heights less than all of the pages within a block and using more than one programmable device improve performance. For example, if a flash memory device only has one write command in its queue, reducing the height of the stripe allows for more programmable devices to be used to store the data. For instance, in the example given earlier, if a flash device receives a write command that would take eight seconds for one programmable device to store, the flash device could store the write command in two seconds if four programmable devices are used.

Figure 5:
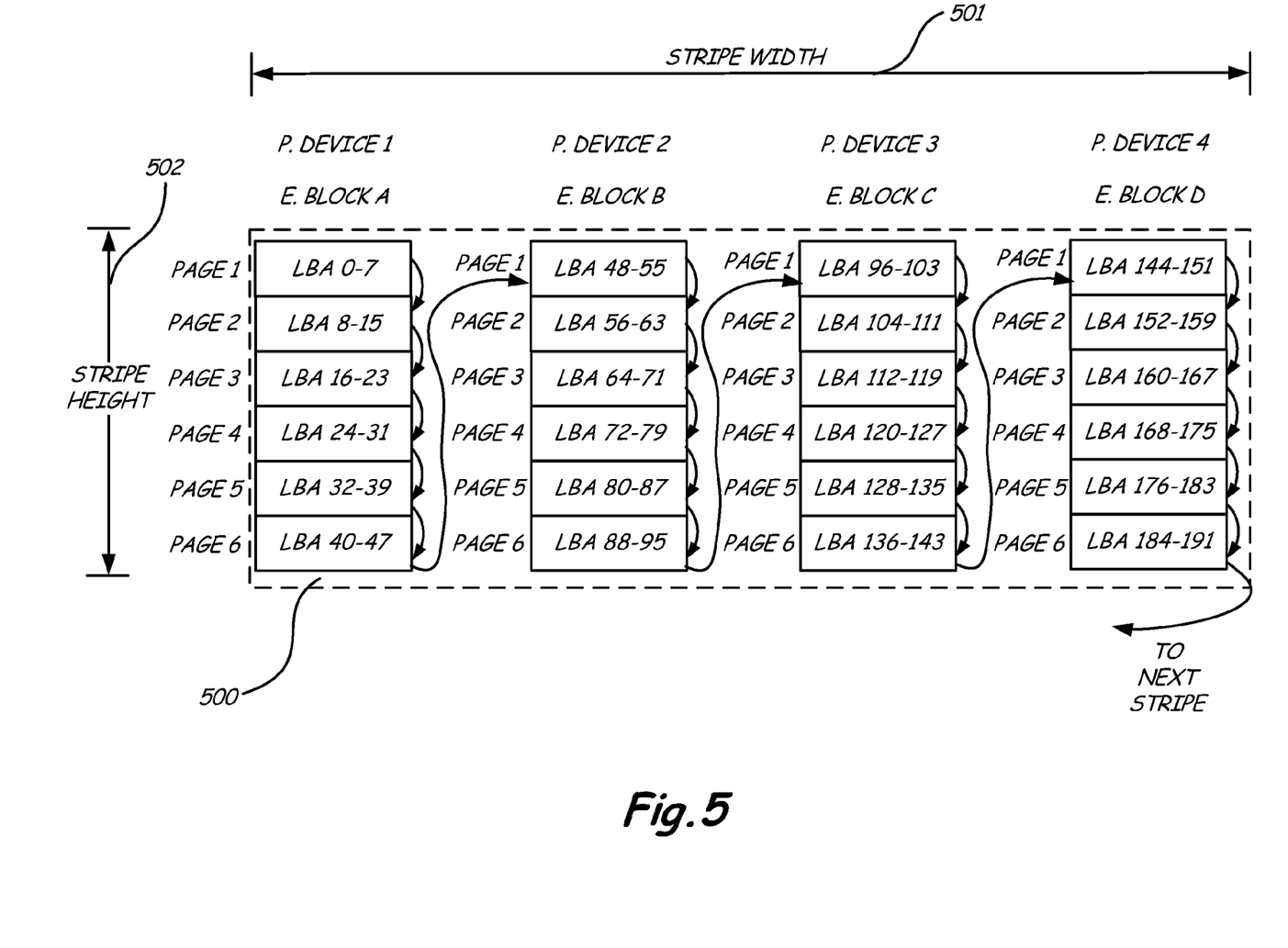
FIG. 5 is a schematic diagram of a logical block addressing scheme for a data stripe having a height greater than one page.
Figure 6:
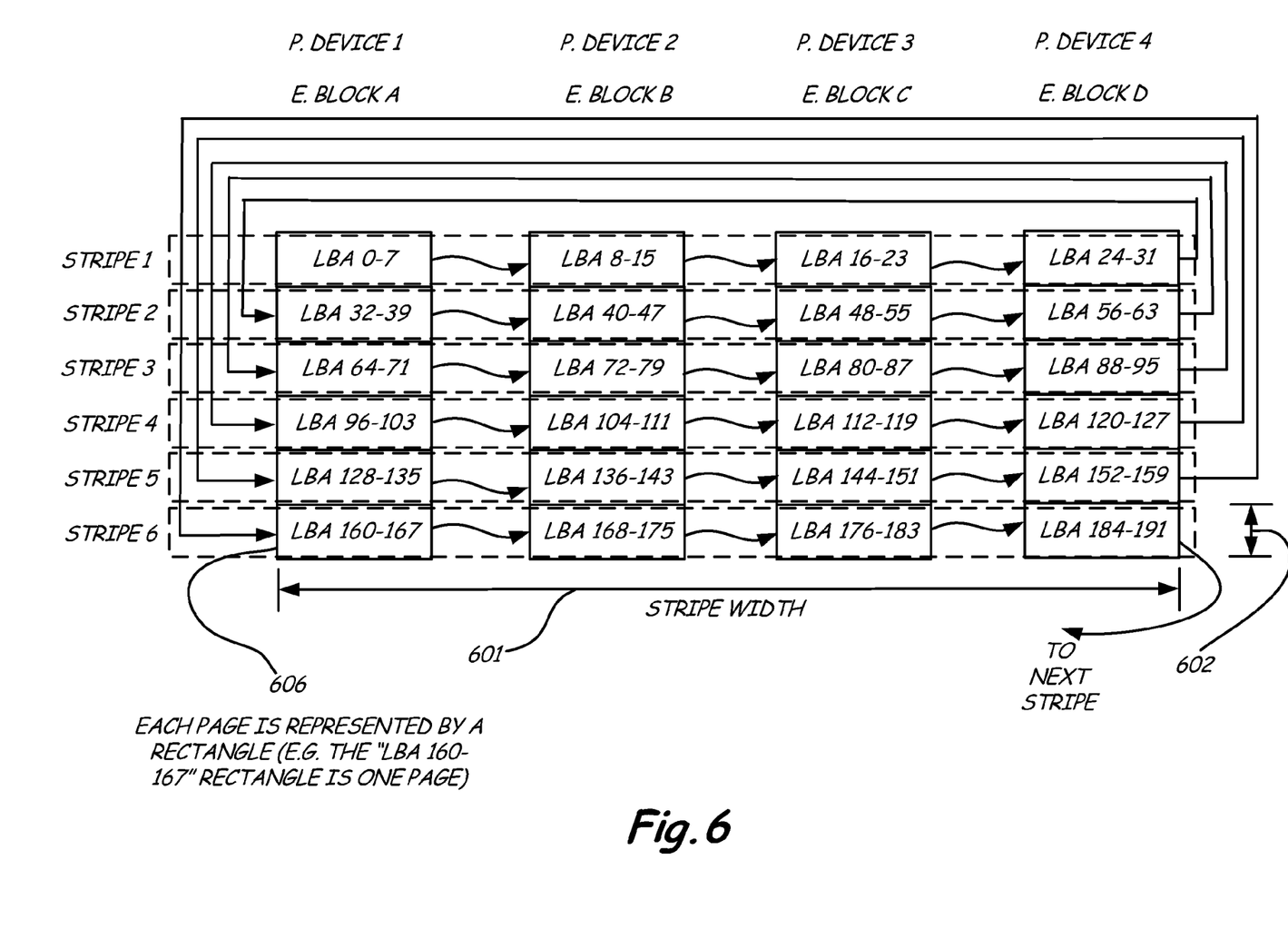
FIG. 6 is a schematic diagram of a logical block addressing scheme for data stripes having heights of one page.

Another aspect of the present disclosure includes a logical block addressing (LBA) scheme or method. Pages are illustratively given logical block addresses that correspond to the order in which data is written to or mapped to the pages. In certain embodiments, the LBA schemes and methods are utilized in implementing the data stripes described above. FIGS. 5-6 are simplified illustrations of LBA schemes. LBA schemes according to the present disclosure are not however limited to stripes having any particular width or height and include stripes having any width or height.

FIG. 5 shows an LBA scheme for a stripe 500 having a width 501 of four programmable devices and a height 502 of six pages. As can be seen in the figure, the logical block addresses start at the first page of the first programmable device (i.e. the page with LBA 0-7), increase going to the last page of the stripe in the first programmable device (i.e. the page with LBA 40-47), and then continue on likewise for the rest of the programmable devices in the stripe. In the example shown in FIG. 5, there are eight LBAs per a page. This corresponds to pages of 4 kilobytes and LBAs of 512 bytes, or alternatively to dual pages of 2 kilobytes per a single page and LBAs of 512 bytes. Obviously, embodiments are not limited to any particular size of pages or LBAs.

FIG. 6 shows an LBA scheme for six stripes having widths 601 of four programmable device and heights 602 of one page 606. As can be seen in the figure, because the stripe heights are only one page, consecutive pages within an erasure block are not consecutively numbered. Instead, the LBA scheme numbers the page in the erasure block of the first programmable device (i.e. the page with LBA 0-7), then numbers the page in the erasure block of the second programmable device (i.e. the page with LBA 8-15), and so on until all of the pages in the stripe are numbered. The LBA scheme then numbers the second page in the erasure block of the first programmable device (i.e. the page with LBA 32-39) when it begins to number the second stripe.

Figure 7:
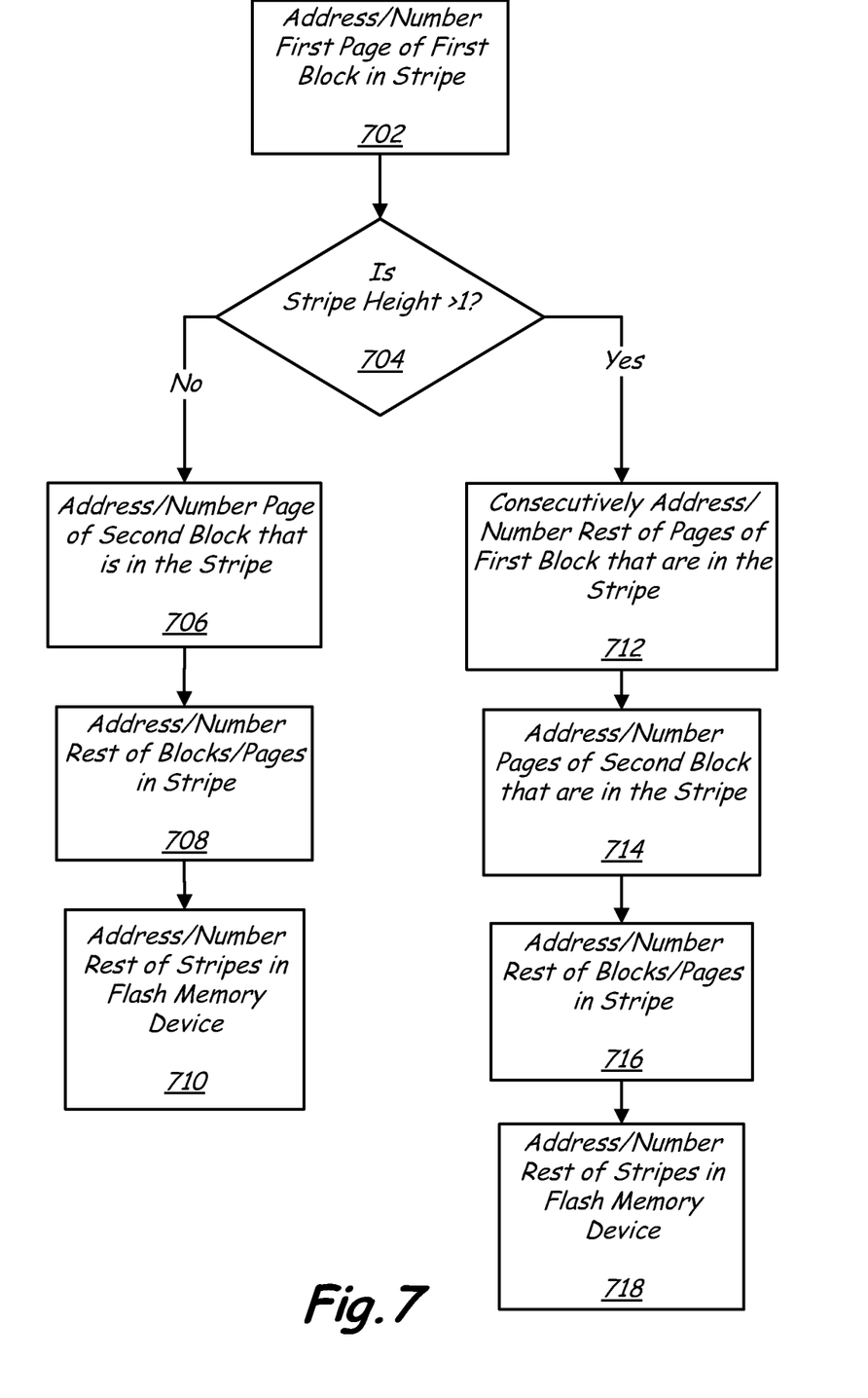
FIG. 7 is a flow chart illustrating a method of addressing pages in a flash memory device.

FIG. 7 is a flow chart illustrating the LBA schemes described above in more general terms. At block 702, the first page of the first block in a stripe is numbered. The method then diverges at block 704. If the stripe height is one page, the method continues to block 706 and the page in the second block that is part of the stripe is numbered. At block 708, the remainder of the pages in the stripe are numbered, and at block 710, the method is continued for the remainder of the stripes in the flash memory device.

If the stripe height is greater than one page, the method goes from block 704 to block 712 where the rest of the pages of the stripe in the first block are consecutively numbered. At block 714, the pages in the second block that are part of the stripe are numbered. At block 716, the rest of the pages in the stripe are numbered, and at block 718, the method is continued for the remainder of the stripes in the flash memory device.

One advantage of the logical block addressing described above is that it may require less information to be stored for implementation. Physical locations within a flash memory array are commonly specified by indicating the programmable device, the erasure block, the page, and the offset within the page (e.g. when LBAs are smaller than a page). At least certain embodiments of the present disclosure do not need to store all of this information to identify the physical locations of LBAs. For example, in an embodiment, the only information that needs to be stored (e.g. in an LBA-to-physical location table or mapping) is the programmable device and the erasure block where each LBA is located. For example, in a situation where there are 512 LBAs in an erasure block, the flash memory device does not need to know in which page and offset each of the 512 LBAs are specifically located. Instead, the flash memory device knows that the LBAs are numbered sequentially in order throughout the erasure block. Accordingly, since the flash memory device knows all of the LBAs in the erasure block, the flash memory device is able to determine the page and offset of where each of the LBAs are located. This feature illustratively reduces storage requirements by not requiring page and offset information for each LBA.

As has been described above, reducing stripe width to less than all of the programmable devices and/or increasing stripe height to more than one page per a block individually and in combination improve flash lifetime by reducing the number of program and erase cycles. Performance, for example the rate of data storage, is also illustratively enhanced by utilizing multiple programmable devices concurrently to store data. Certain embodiments also optionally include a logical block addressing scheme that is utilized in storing data to the stripes.

Finally, it is to be understood that even though numerous characteristics and advantages of various embodiments have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. In addition, although the embodiments described herein are directed to flash memory devices, it will be appreciated by those skilled in the art that the teachings of the disclosure can be applied to other types of data storage systems, without departing from the scope and spirit of the disclosure.

What is claimed is:

1. A flash memory device comprising:
a plurality of programmable devices that are configured to simultaneously store data;
a plurality of erasure blocks within each of the plurality of programmable devices, each of the plurality of erasure blocks having pages of transistors; and
a plurality of stripes, each of the plurality of stripes having a width that includes more than one and less than all of the plurality of programmable devices within the flash memory device,
wherein at least one of the plurality of stripes has a height of more than one page of transistors, and wherein each of the pages of transistors corresponds to a unique set of logical block addresses, and
wherein a logical block addressing scheme utilized in the flash memory device employs logical block addresses, including the unique set of logical block addresses, that consecutively number the pages within the width and the height of each one of the plurality of stripes, and
wherein different ones of the pages within at least one of the plurality of erasure blocks are non-consecutively numbered by the logical block addresses due to the different ones of the pages being distributed amongst different ones of the plurality of stripes.

2. The device of claim 1, wherein the widths of at least two of the plurality of stripes include a different number of the plurality of programmable devices, and wherein at least one of the plurality of stripes has a height that includes more than one and less than all of the pages of transistors within one of the plurality of erasure blocks.

3. The device of claim 1, wherein at least one of the plurality of stripes has a height of one page, wherein the device further comprises a flash memory device controller that is configured to concurrently store data to each of the programmable devices within one of the stripes, and wherein the flash memory device controller is also configured to erase data from all of the pages of transistors within one of the erasure blocks before storing new data to any of the pages within the one of the erasure blocks.

4. The device of claim 1, wherein at least one of the plurality of stripes has a height that corresponds to a range of the consecutively numbered pages.

5. The device of claim 1, wherein at least one of the plurality of stripes has a height of all the pages of transistors in one of the erasure blocks.

6. The device of claim 1, wherein at least one of the plurality of stripes has a height of one of the pages of transistors in one of the erasure blocks.

7. The device of claim 1, and further comprising a cache that stores a plurality of write commands, and wherein each of the write commands is divided into multiple segments and each of the multiple segments is stored to more than one of the stripes.

8. The device of claim 7, wherein the cache is implemented in a non-volatile memory, and wherein the multiple segments are stored to the more than one of the stripes concurrently.

9. A memory device comprising:
   a plurality of programmable devices;
   a plurality of erasure blocks within each of the plurality of programmable devices, each of the plurality of erasure blocks having pages; and
   a plurality of stripes, each of the plurality of stripes having a width that includes more than one and less than all of the plurality of programmable devices within the memory device,
   wherein at least one of the plurality of stripes has a height of more than one page, and wherein each of the pages corresponds to a unique set of logical block addresses, and
   wherein a logical block addressing scheme utilized in the memory device employs logical block addresses, including the unique set of logical block addresses, that are mapped to correspond with the width and the height of each one of the plurality of stripes, and
   wherein the mapping is independent of widths and heights of the plurality of erasure blocks.

10. The device of claim 9, wherein the plurality of programmable devices are dual programmable devices.

11. The device of claim 9, wherein the plurality of pages are dual pages, and wherein the plurality of programmable devices are included within one physical unit.

12. The device of claim 9 wherein the erasure blocks are dual erasure blocks, and wherein the device further comprises a memory device controller that is configured to erase data from all of the pages of within one of the erasure blocks before storing new data to any of the pages within the one of the erasure blocks.

13. The device of claim 9, wherein at least some of the stripes have a same number of the pages.

14. The device of claim 9, wherein at least two of the plurality of stripes have different sizes, and wherein at least some of the stripes have a different number of the pages of transistors.

15. A method of storing data to a flash memory device, the method comprising:
   receiving a write command;
   dividing the write command into multiple segments;
   organizing a flash memory array of the flash memory device into data stripes;
   storing one of the multiple segments to a first page of at least two consecutive pages within a first erasure block of the flash memory array; and
   storing another one of the multiple segments to a first page of at least two consecutive pages within a second erasure block of the flash memory array concurrently with storing the one of the multiple segments;
   addressing the first page within the first erasure block and the first page within the second erasure block with two consecutive logical numbers; and
   addressing the second consecutive page within the first erasure block with a logical number other than the two consecutive logical numbers,
   wherein the logical number assigned to the first page within the first erasure block and the logical number assigned to the second consecutive page within the first erasure block are not consecutive, and
   wherein the first page within the first erasure block and the first page within the second erasure block are a part of a first one of the data stripes, and
   wherein the second page within the first erasure block is a part of a second one of the data stripes.

16. The method of claim 15, further comprising:
   caching additional write commands; and
   concurrently storing the additional write commands into the flash memory array.

17. The method of claim 15, further comprising:
   erasing data from all of the pages within one of the erasure blocks before storing new data to any of the pages within the one of the erasure blocks.

* * * * *